United States Patent
Kang et al.

(10) Patent No.: US 11,552,082 B2
(45) Date of Patent: Jan. 10, 2023

(54) REDUCING GATE INDUCED DRAIN LEAKAGE IN DRAM WORDLINE

(71) Applicant: Applied Materials, Inc., Santa Clara, CA (US)

(72) Inventors: Sung-Kwan Kang, San Jose, CA (US); Gill Yong Lee, San Jose, CA (US); Sang Ho Yu, Cupertino, CA (US); Shih Chung Chen, Cupertino, CA (US); Jeffrey W. Anthis, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 168 days.

(21) Appl. No.: 17/002,415

(22) Filed: Aug. 25, 2020

(65) Prior Publication Data
US 2020/0388621 A1    Dec. 10, 2020

Related U.S. Application Data (62) Division of application No. 16/204,300, filed on Nov. 29, 2018, now Pat. No. 10,790,287.

(51) Int. Cl.
| | |
|---|---|
| H01L 21/3213 | (2006.01) |
| H01L 21/28 | (2006.01) |
| H01L 21/321 | (2006.01) |
| H01L 21/02 | (2006.01) |
| H01L 27/108 | (2006.01) |
| H01L 29/49 | (2006.01) |
| H01L 29/423 | (2006.01) |

(52) U.S. Cl.
CPC .. *H01L 27/10823* (2013.01); *H01L 21/28088* (2013.01); *H01L 21/32135* (2013.01); *H01L 27/10876* (2013.01); *H01L 27/10891* (2013.01); *H01L 29/42372* (2013.01); *H01L 29/4966* (2013.01); *H01L 21/0228* (2013.01); *H01L 21/02274* (2013.01); *H01L 21/3212* (2013.01); *H01L 29/42364* (2013.01)

(58) Field of Classification Search
None
See application file for complete search history.

(56) References Cited

U.S. PATENT DOCUMENTS

| | | | |
|---|---|---|---|
| 6,395,597 B2 | 5/2002 | Noble | |
| 7,723,755 B2 | 5/2010 | Lee et al. | |
| 8,008,144 B2 | 8/2011 | Ananthan et al. | |
| 9,704,961 B2 | 7/2017 | Jang | |

(Continued)

FOREIGN PATENT DOCUMENTS

WO    9917351 A1    4/1999

OTHER PUBLICATIONS

Sargent-Welch Periodic Table of the Elements (Year: 1980).*

(Continued)

*Primary Examiner* — Erik Kielin
(74) *Attorney, Agent, or Firm* — Servilla Whitney LLC (57) ABSTRACT

Memory devices and methods of forming memory devices are described. The memory devices comprise two work-function metal layers, where one work-function layer has a lower work-function than the other work-function layer. The low work-function layer may reduce gate-induced drain leakage current losses. Methods of forming memory devices are also described.

10 Claims, 3 Drawing Sheets

(56) References Cited

U.S. PATENT DOCUMENTS

| | | | |
|---|---|---|---|
| 10,403,552 B1 | 9/2019 | Sung et al. | |
| 2005/0110098 A1* | 5/2005 | Yoshihara | H01L 21/823437 |
| | | | 257/E21.639 |
| 2012/0231626 A1* | 9/2012 | Lee | C23C 16/45529 |
| | | | 438/653 |
| 2015/0093891 A1 | 4/2015 | Zope et al. | |
| 2015/0214362 A1 | 7/2015 | Oh | |
| 2016/0315088 A1 | 10/2016 | Kang et al. | |
| 2017/0117190 A1* | 4/2017 | Chung | H01L 29/4966 |
| 2017/0125532 A1 | 5/2017 | Jang | |
| 2017/0186844 A1 | 6/2017 | Kim et al. | |
| 2017/0365608 A1* | 12/2017 | Lee | H01L 27/10823 |
| 2018/0174845 A1 | 6/2018 | Jang et al. | |
| 2019/0109198 A1 | 4/2019 | Hsieh et al. | |
| 2019/0115351 A1* | 4/2019 | Jeon | H01L 27/10814 |

OTHER PUBLICATIONS

Agarwal, S K, et al., "Growth of polysilicon and silicide films for MOS-VLSI application", Bull. Mater. Sci., vol. 8 No. 3, Jun. 1986.

Gautam, S. K., et al., "Reduction of GIDL using Dual Work-Function Metal Gate in DRAM", Dept. of Electronics and Communication Engineering, IIT Roorkee, Jul. 16, 2016.

Saino, K., et al., "Impact of Gate-Induced Drain Leakage Current on the Tail Distribution of DRAM Data Retention Time", Dept. of Electrical Engineering and Computer Sciences, University of California at Berkeley, CA, 2000.

* cited by examiner

REDUCING GATE INDUCED DRAIN LEAKAGE IN DRAM WORDLINE

CROSS-REFERENCE TO RELATED APPLICATIONS

This application is a Divisional of U.S. application Ser. No. 16/204,300, filed on Nov. 29, 2018, the entire disclosure of which is hereby incorporated by reference herein.

TECHNICAL FIELD

Embodiments of the present disclosure pertain to the field of electronic devices and electronic device manufacturing. More particularly, embodiments of the disclosure provide dynamic random-access memory cells with buried word lines having reduced gate induced drain leakage.

BACKGROUND

Electronic devices, such as personal computers, workstations, computer servers, mainframes and other computer related equipment such as printers, scanners and hard disk drives use memory devices that provide substantial data storage capability, while incurring low power consumption. There are two major types of random-access memory cells, dynamic and static, which are well-suite for use in electronic devices. Dynamic random-access memories (DRAMs) can be programmed to store a voltage which represents one of two binary values, but require periodic reprogramming or "refreshing" to maintain this voltage for more than very short periods of time. Static random-access memories (SRAM) are so named because they do not require periodic refreshing.

DRAM memory circuits are manufactured by replicating millions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and to increase memory cell density to allow more memory to be squeezed onto a single memory chip, especially for densities greater than 256 Megabits. Limitations on cell size reduction include the passage of both active and passive word lines through the cell, the size of the cell capacitor, and the compatibility of array devices with non-array devices.

Traditionally, DRAM word line utilize high work-function materials as a gate electrode in order to reduce channel impurities. An important leakage component in DRAM devices is gate-induced drain leakage (GIDL), which is caused by trap assisted band-to-band tunneling at the surface of the drain of the transistor, where the gate overlaps the drain. During fabrication, interface states in the substrate are created. These surface states increase the rate of generation of electron-hole pairs, enhancing GIDL. High work-function materials, used in DRAM word line, can increase gate induced drain leakage near the source/drain area due to band-to-band-tunneling. Thus, there is a need for a DRAM cell that can keep resistance low while also keeping gate induced drain leakage low.

SUMMARY

Embodiments of the disclosure are directed to memory devices and methods of forming memory devices. In one or more embodiments, a memory device comprises: a substrate with a substrate surface having a plurality of trenches extending a depth into the substrate, each trench including a bottom and sidewall; a gate oxide layer on the bottom and sidewall of the trenches; a recessed metal layer on the gate oxide layer, the recessed metal layer comprising a first work-function metal layer and a bulk metal layer, the recessed metal layer having a top surface within the depth of the trench; and a second work-function metal layer on the recessed metal layer.

In one or more embodiments, a method of forming a memory device comprises: providing a substrate having plurality of trenches thereon; depositing a conformal gate oxide layer on the substrate; forming a metal layer on the gate oxide layer; recessing the metal layer to form a recessed metal layer; and depositing a second work-function metal layer on the recessed metal layer.

In one or more embodiments, a memory cell comprises: a recessed access device; and a word line electrically coupled to the recessed access device, the word line comprising a substrate with a substrate surface having a plurality of trenches extending a depth into the substrate, each trench including a bottom and sidewall; a gate oxide layer on the bottom and sidewall of the trenches; a recessed metal layer on the gate oxide layer, the recessed metal layer comprising a first work-function metal layer and a bulk metal layer, the recessed metal layer having a top surface within the depth of the trench; and a second work-function metal layer on the recessed metal layer.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "precursor", "reactant", "reactive gas" and the like are used interchangeably to refer to any gaseous species that can react with the substrate surface.

Figure 1:
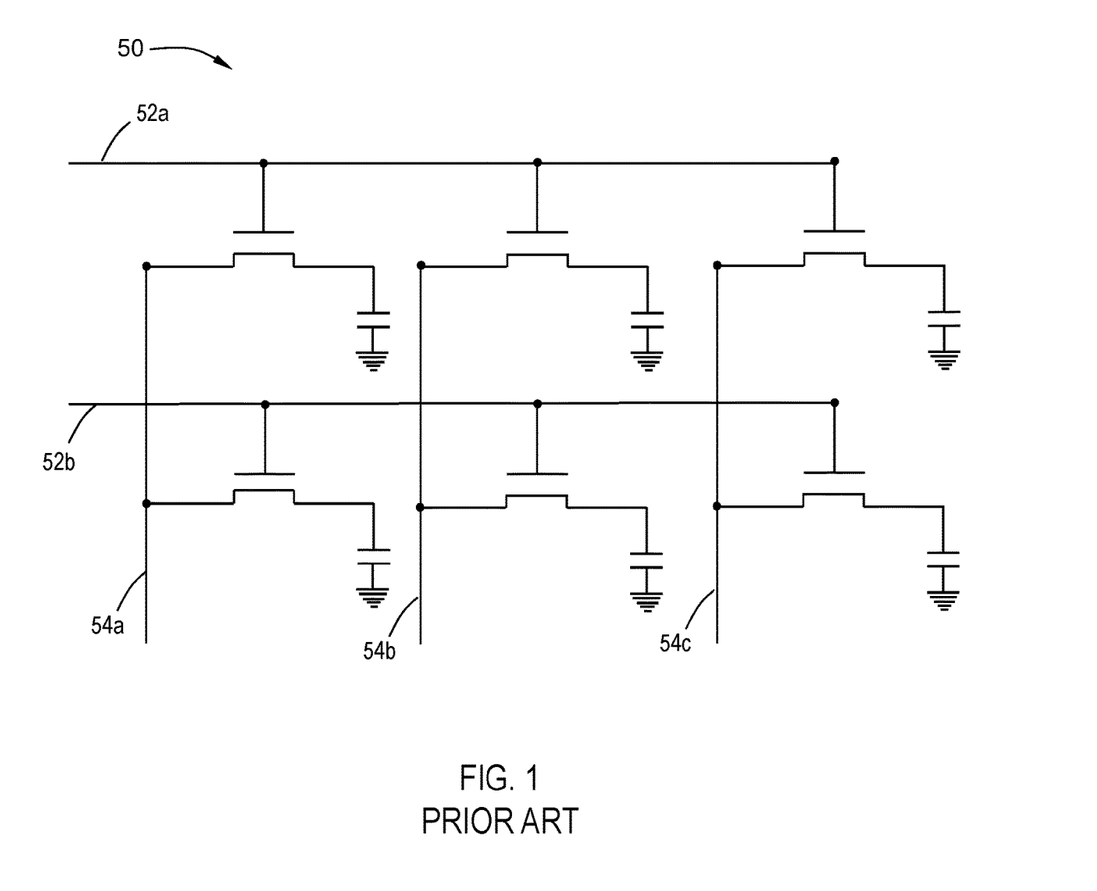
FIG. 1 illustrates a circuit diagram of a DRAM cell block in accordance with the prior art.

As used herein, the term "dynamic access random memory" or "DRAM" refers to a memory cell that stores a datum bit by storing a packet of charge (or not, for a zero) on a capacitor; the charge is gated onto the capacitor via an access transistor, and sensed by turning on the same transistor and looking at the voltage perturbation created by dumping the charge packet on the interconnect line on the transistor output. Thus, a single DRAM cell is made of one transistor and one capacitor. The DRAM device, as illustrated in FIG. 1, is formed of an array of DRAM cells. The rows on access transistors are linked by word lines 52a, 52b, and the transistor inputs/outputs are linked by bitlines 54a, 54b, 54c. Historically, DRAM capacitors have evolved from planar polysilicon-oxide-substrate plate capacitors to 3-D structures which have diverged into "stack" capacitors with both plates above the substrate), and "trench" capacitors using an etched cavity in the substrate as the common plate.

Traditionally, DRAM cells have recessed high work-function metal structures in buried word line structure. In a DRAM device, a bitline is formed in a metal level situated above the substrate, while the word line is formed at the polysilicon gate level at the surface of the substrate. In the buried word line (bWL) a word line is buried below the surface of a semiconductor substrate using a metal as a gate electrode.

In one or more embodiments, memory devices, e.g. DRAM cells, are provided which utilize a low work-function material on top of a high work-function material. Such memory devices advantageously keep resistance low, while also keeping gate induced drain leakage (GIDL) low. Buried word line cell array transistors have a word line buried below the surface of a semiconductor substrate using a metal as a gate electrode in the structure.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the Surface through which the implantation takes place. Thus, the regions illustrated in the figures are schematic in nature and their shapes may be not intended to illustrate the actual shape of a region of a device and are not intended to limit the scope of example embodiments.

Figure 2:
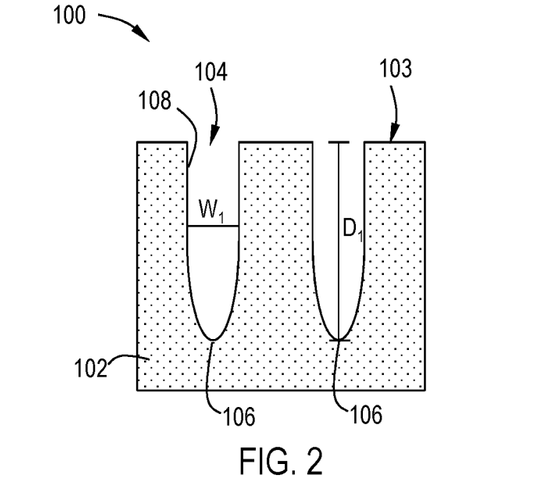
FIG. 2 illustrates a cross-section view of a device according to one or more embodiments of the disclosure.

FIGS. 2 through 9 are cross-sectional views illustrating a memory device 100 according to one or more embodiments. Referring to FIG. 2, a substrate 102 is formed having a plurality of trenches 104 forming a recessed channel. The trenches have a bottom 106 and sidewall 108. The plurality of trenches 104 may be formed so as to have a width within a range of about 10 to about 100 nm, including, but not limited to a range of about 10 nm to about 80 nm, about 10 nm to about 70 nm, about 10 nm to about 60 nm, about 10 nm to about 50 nm, or about 10 nm to about 40 nm. As will be recognized by one of skill in the art, the width of the plurality of trenches 104 is defined by a distance $W_1$ from one sidewall 108 to another sidewall 108. As will be recognized by one of skill in the art, the depth of the plurality of trenches 104 is defined by the distance $D_1$ from the substrate surface 103 to the bottom 106 of the plurality of trenches 104.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

In order to form the plurality of trenches 104, a buffer insulating layer (e.g. a silicon oxide layer, not shown) may be formed on the substrate surface 103, and/or a hard mask layer (e.g. a nitride layer, not illustrated) may be formed. Such technique is well known to those skilled and the art, and, thus, is not illustrated.

Figure 3:
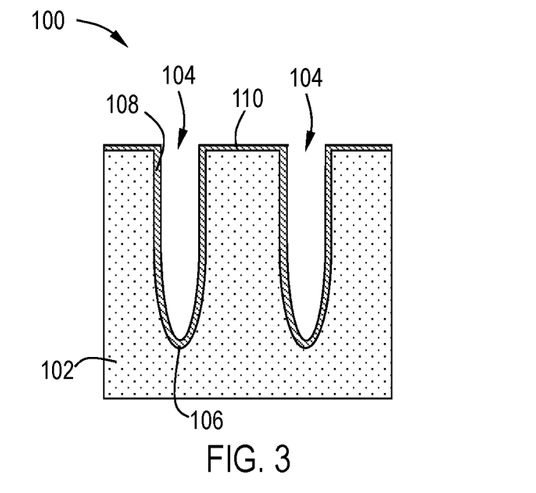
FIG. 3 illustrates a cross-section view of a device according to one or more embodiments of the disclosure.

With reference to FIG. 3, a gate oxide layer 110 is conformally deposited on the substrate 102, on the substrate surface 103 and along the sidewall 108 and bottom 106 of the plurality of trenches 104. In one or more embodiments, the gate oxide layer 110 comprises one or more of silicon oxynitride (SiON), silicon oxide, or a high-κ dielectric material. While the term "silicon oxide" may be used to describe the gate oxide layer 110, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g. silicon nitride, silicon oxynitride, tungsten oxide, zirconium oxide, aluminum oxide, hafnium oxide, and the like.

In one or more embodiments, the term "high-κ dielectric" refers to a material with a high dielectric constant (as compared to, e.g. silicon dioxide). In one or more embodiments, the high-κ dielectric material is selected from one or more of hafnium oxide ($HfO_2$), zirconium oxide ($ZrO_2$), vanadium oxide ($VO_2$), titanium oxide ($TiO_2$), tin oxide ($SnO_2$), aluminum oxide ($Al_2O_3$), zinc oxide (ZnO), hafnium silicon oxide (HfSiO), or zirconium silicon oxide (ZrSiO).

In one or more embodiments, the gate oxide layer 110 has a thickness in a range of about 1 nm to about 7 nm, including about 1 nm, about 2 nm, about 3 nm, about 4 nm, about 5 nm, about 6 nm, or about 7 nm.

Figure 4:
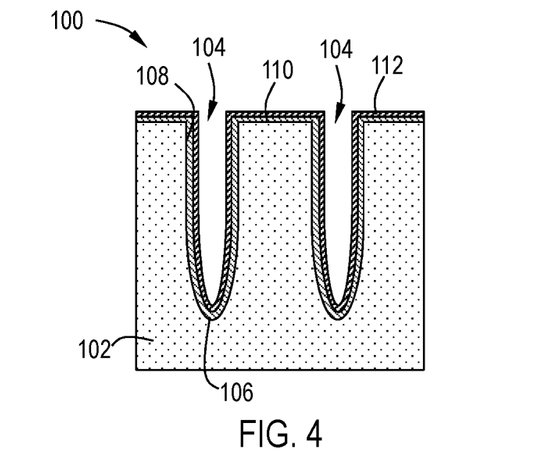
FIG. 4 illustrates a cross-section view of a device according to one or more embodiments of the disclosure.
Figure 5:
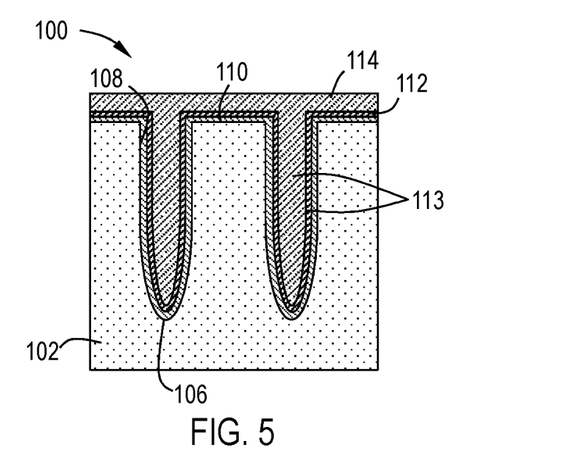
FIG. 5 illustrates a cross-section view of a device according to one or more embodiments of the disclosure.

With reference to FIGS. 4 and 5, a metal layer 113 is formed on the gate oxide layer 110. In one or more embodiments, the metal layer 113 is formed by depositing a conformal first work-functional metal layer 112 (see FIG. 4) on the conformal gate oxide layer 110, followed by depositing a bulk metal layer 114 (see FIG. 5) on the first work-function metal layer 112. The bulk metal layer 114 is deposited using any one of a number of methods known to one of skill in the art, including, but not limited to, chemical vapor deposition, physical vapor deposition, or atomic layer deposition.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. aluminum precursor) is pulsed into the reaction zone followed by a first time delay. Next, a second precursor or compound B (e.g. oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

As used herein, the term "work-function" refers to the bulk chemical potential of a material (e.g. metal) relative to the vacuum level. In one or more embodiments, the first work-function metal layer has a work function greater than or equal to 4.3 eV. In some embodiments, the first work-function metal layer has a work function greater than or equal to 4.5 eV. In other embodiments, the first work-function metal layer has a work-function greater than or equal to 4.3 eV, including greater than or equal to 4.4 eV, greater than or equal to 4.5 eV, greater than or equal to 4.6, greater than or equal to 4.7 eV, greater than or equal to 4.8 eV, greater than or equal to 4.9 eV, greater than or equal to 5.0 eV, greater than or equal to 5.1 eV, or greater than or equal to 5.2 eV.

In one or more embodiments, the first work-function metal layer comprises a metal nitride. In one more embodiments, the first work-function metal layer comprises one or more of titanium nitride (TiN), tungsten nitride (WN), tantalum nitride (TaN), molybdenum nitride (MoN), TaN/TiN, or WN/TiN. In one more embodiments, the first work-function metal layer is selected from the group consisting of titanium nitride (TiN), tungsten nitride (WN), tantalum nitride (TaN), molybdenum nitride (MoN), TaN/TiN, WN/TiN, and combinations thereof. In one or more embodiments, the first work-function metal layer comprises titanium nitride. In one or more embodiments, the first work-function metal layer may also be referred to the high/mid work-function metal layer.

In one or more embodiments, the first work-function metal layer 112 has a thickness in a range of about 1 nm to about 5 nm, including about 1 nm, about 2 nm, about 3 nm, about 4 nm, or about 5 nm.

Figure 6:
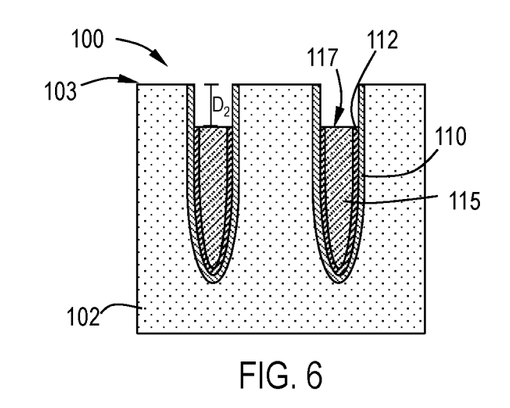
FIG. 6 illustrates a cross-section view of a device according to one or more embodiments of the disclosure.

In one or more embodiments, the bulk metal layer 114 is also known as the word-line. With reference to FIG. 6, the bulk metal layer 114 (i.e. the word-line) is buried (recessed) by chemical mechanical polishing (CMP) and etch back such that the bulk metal layer 114 and the first work-function metal layer 112 do not protrude beyond the substrate surface 103 (e.g. so that the bulk metal layer 114 is completely buried within the substrate 102).

In one or more embodiment, the buried word line 115 (i.e. the recessed bulk metal layer 115) may be formed by forming a word line layer 114 (i.e. bulk metal layer 114) on the substrate 102 so as to bury the trench 104. The word line layer 114 may then be polished using a chemical mechanical polishing (CMP) method and etched back using a dry etch process to expose the substrate surface 103. The buried word line 115 may be formed by recessing the polished word line layer 114 into the substrate 102 using a partial etch process. As illustrated in FIG. 6, the first work-function metal layer 112 is recessed to the same level as the buried word line 115. A top surface 117 of the buried word line 115 and the first work-function metal layer 112 is a recess depth or distance $D_2$ from the substrate surface 103 in the plurality of trenches 104. In one or more embodiments, the buried word line 115 has a top surface 117 within the depth $D_1$ of the trench 104. Accordingly, in one or more embodiments $D_2$ is less than $D_1$.

In one or more embodiments, the bulk metal layer 114 (i.e. the word line) comprises one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh). In one or more embodiments, the bulk metal layer 114 comprises tungsten (W). In other embodiments, the bulk metal layer 114 comprises ruthenium (Ru). In one or more embodiments, the buried word line 115 (i.e. the recessed bulk metal layer 115) comprises one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh). In one or more embodiments, the buried word line 115 comprises tungsten (W). In other embodiments, the buried word line 115 comprises ruthenium (Ru).

Figure 7:
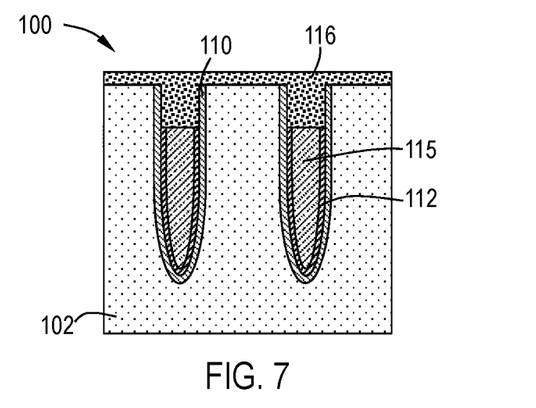
FIG. 7 illustrates a cross-section view of a device according to one or more embodiments of the disclosure.
Figure 8:
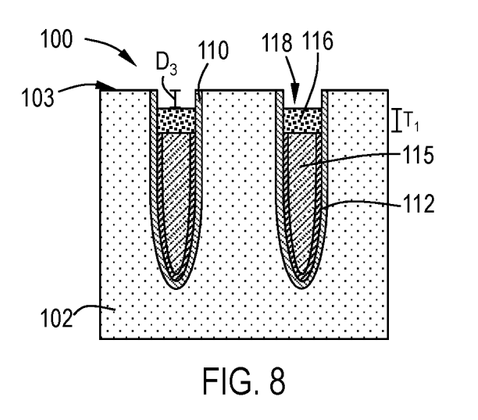
FIG. 8 illustrates a cross-section view of a device according to one or more embodiments of the disclosure.

With reference to FIG. 7, in one or more embodiments, a second work-function metal layer 116 is deposited on the substrate 102 on the recessed bulk metal layer 115 (i.e. on the buried word line). Referring to FIG. 8, the second work-function metal layer 116 is then polished using a chemical mechanical polishing (CMP) method and etched back to expose the substrate surface 103. A top surface 118 of the second work-function metal layer 116 is a distance $D_3$ from the substrate surface 103 in the plurality of trenches 104. In one or more embodiments, the second work-function metal layer 116 has a top surface 118 within the depth $D_1$ of the trench 104. Accordingly, in one or more embodiments $D_3$ is less than $D_1$.

In one or more embodiments, the second work-function metal layer 116 has a work-function that is less than the work-function of the first work-function layer. In one or more embodiments, the second-work function metal layer 116 has a work-function less than about 4.3 eV. In some embodiments, the second work-function metal layer 116 has a work function less than or equal to about 4.2 eV. In some embodiments, the work-function of the second work-function metal layer 116 is less than or equal to about 4.25 eV, less than or equal to about 4.2 eV, less than or equal to about 4.15 eV, less than or equal to about 4.1 eV, less than or equal to about 4.05 eV, less than or equal to about 4 eV, less than or equal to about 3.5 eV, or less than or equal to about 3.0 eV.

In one or more embodiments, the second work-function metal layer 116 may also be known as the low work-function layer. Resistivity is a property of a material that quantifies how strongly that material opposes the flow of electric current. A low resistivity indicates that a material readily permits the flow of electric current. High resistivity materials do not readily permit the flow of electric current. As used herein, the term "high resistivity material" refers to a material or substance having a resistivity of greater than about 500 μΩ-cm. In one or more embodiments, the second work-function metal layer 116 has a resistivity of less than about 500 μΩ-cm, including less than about 400 μΩ-cm, less than about 300 μΩ-cm, less than about 200 μΩ-cm, or less than about 100 μΩ-cm. In one or more specific embodiments, the second work-function metal layer 116 is substantially free of polysilicon and/or doped polysilicon. As used herein, the term "substantially free" means that there is less than 5%, including less than 4%, less than 3%, less than 2%, less than 1%, and less than 0.5% of polysilicon and/or doped polysilicon present in the second work-function metal layer 116. As used herein, the term "polysilicon" or "poly-Si" refers to a form of polycrystalline silicon.

In one or more embodiments, the second work-function metal layer 116 comprises a metal carbide or a metal silicide with one or more metal selected from aluminum (Al), gallium (Ga), indium (In), or thallium (Th). As used herein, the term "metal carbide" refers to a composite material composed of carbon and, generally, a less electronegative metal. As used herein, the term "metal silicide" refers to a composite material composed of silicon and, generally, a more electropositive metal. As recognized by the skilled artisan, metal silicides, which are composite materials, are distinct from polysilicon and doped polysilicon.

In other embodiments, the second work-function metal layer 116 comprises a metal carbide or a metal silicide with one or more metal selected from gallium (Ga), indium (In), or thallium (Th). In one or more embodiments, the second work-function metal layer 116 comprises aluminum carbide or aluminum silicide. In one or more embodiments, the second work-function metal layer 116 comprises gallium carbide or gallium silicide. In one or more embodiments, the second work-function metal layer 116 comprises indium carbide or indium silicide. In one or more embodiments, the second work-function metal layer 116 comprises thallium carbide or thallium silicide. In one or more embodiments, the second work-function metal layer 116 comprises one or more metal selected from aluminum (Al), gallium (Ga), indium (In), or thallium (Th). In other embodiments, the second work-function metal layer 116 comprises one or more metal selected from gallium (Ga), indium (In), or thallium (Th). In one or more embodiments, the second work-function metal layer 116 comprises aluminum. In one or more embodiments, the second work-function metal layer 116 comprises gallium. In one or more embodiments, the second work-function metal layer 116 comprises indium. In one or more embodiments, the second work-function metal layer 116 comprises thallium.

In one or more embodiments, the second work-function metal layer 116 has a thickness $T_1$ in a range of about 10 nm to about 50 nm, including about 10 nm, about 15 nm, about 20 nm, about 25 nm, about 30 nm, about 35 nm, about 40 nm, about 45 nm, or about 50 nm.

Figure 9:
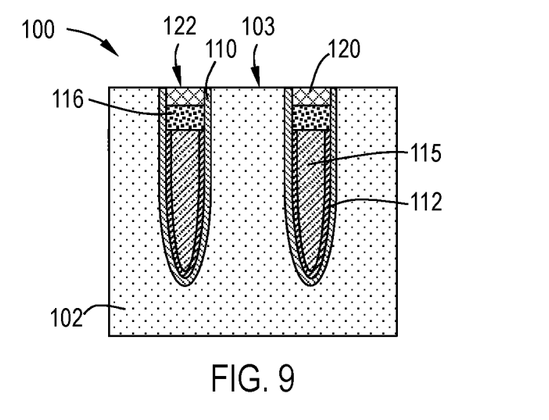
FIG. 9 illustrates a cross-section view of a device according to one or more embodiments of the disclosure.

Referring to FIG. 9, an insulating layer 120 is deposited on the second work-function metal layer 116. In one or more embodiments, the insulating layer has a top surface 122 substantially coplanar with the substrate surface 103.

In one or more embodiments, the insulating layer 120 comprises a dielectric material. As used herein, the term "dielectric" refers to an electrical insulator material that can be polarized by an applied electric field. In one or more embodiments, the dielectric material includes, but is not limited to, oxides, e.g., $SiO_2$, $Al_2O_3$, nitrides, e.g., $Si_3N_4$. In one or more embodiments, the dielectric material comprises silicon nitride ($Si_3N_4$). In some embodiments, the insulating layer composition is non-stoichiometric relative to the ideal molecular formula. For example, in some embodiments, the dielectric material includes, but is not limited to, oxides (e.g., silicon oxide, aluminum oxide), nitrides (e.g., silicon nitride (SiN)), oxycarbides (e.g. silicon oxycarbide (SiOC)), and oxynitrocarbides (e.g. silicon oxycarbonitride (SiNCO)).

One or more embodiments are directed to a memory cell. In one or more embodiments, a memory cell comprises: a recessed access device; and a word line electrically coupled to the recessed access device, the word line comprising a substrate with a substrate surface having a plurality of trenches extending a depth into the substrate, each trench including a bottom and sidewall; a gate oxide layer on the bottom and sidewall of the trenches; a recessed metal layer on the gate oxide layer, the recessed metal layer comprising a first work-function metal layer and a bulk metal layer, the recessed metal layer having a top surface within the depth of the trench; and a second work-function metal layer on the recessed metal layer.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a memory device, the method comprising:
    depositing a conformal gate oxide layer on a substrate having a plurality of trenches extending a depth into the substrate, each trench including a bottom and sidewall, the conformal gate oxide layer formed on a surface of the substrate and along the sidewall and bottom of each of the plurality of trenches;
    depositing a conformal first work-function metal layer on the conformal gate oxide layer and a bulk metal layer on the conformal first work-function metal layer to form a metal layer, the metal layer comprising the conformal first work-function metal layer and the bulk metal layer;
    recessing the metal layer to form a recessed metal layer; and
    depositing a second work-function metal layer on the recessed metal layer,
    wherein the conformal first work-function metal layer comprises a material having a work-function, the second work-function metal layer comprises a material having a work-function, the material of the second work-function metal layer comprising a metal carbide with one or more metal selected from gallium (Ga), indium (In) or thallium (Tl) or a metal silicide with one or more metal selected from aluminum (Al), gallium (Ga), indium (In) or thallium (Tl) and having a work-function that is at least 0.5 eV less than the work-function of the material of the conformal first work-function metal layer, the second work-function metal layer substantially free of polysilicon and/or doped polysilicon.

2. The method of claim 1, wherein recessing the metal layer moves a top surface of the conformal first work-function metal layer and a top surface of the bulk metal layer to a recess depth in the plurality of trenches.

3. The method of claim 1, wherein the second work-function metal layer has a thickness in a range of about 10 nm to about 50 nm.

4. The method of claim 1, wherein the conformal gate oxide layer comprises one or more of silicon oxynitride (SiON), silicon oxide (SiO), or a high-κ dielectric material.

5. The method of claim 1, further comprising etching the second work-function metal layer.

6. The method of claim 5, further comprising depositing an insulating layer on the second work-function metal layer.

7. The method of claim 1, wherein the conformal first work-function metal layer comprises a material having a work-function greater than or equal to 4.6 eV, the second work-function metal layer comprises a material having a work-function less than or equal to 4.05 eV.

8. The method of claim 1, wherein the conformal first work-function metal layer comprises a material having a resistivity of greater than about 500 μΩ-cm and the second work-function metal layer comprises a material having a resistivity of less than about 500 μΩ-cm.

9. A method of forming a memory device, the method comprising:
depositing a conformal gate oxide layer on a substrate having a plurality of trenches extending a depth into the substrate, each trench including a bottom and sidewall, the conformal gate oxide layer formed on a surface of the substrate and along the sidewall and bottom of each of the plurality of trenches;
depositing a conformal first work-function metal layer on the conformal gate oxide layer and a bulk metal layer on the conformal first work-function metal layer to form a metal layer, the metal layer comprising the conformal first work-function metal layer and the bulk metal layer;
recessing the metal layer to form a recessed metal layer; and
depositing a second work-function metal layer on the recessed metal layer,
wherein the conformal first work-function metal layer comprises a material having a work-function, the second work-function metal layer comprises a material having a work-function, the material of the second work-function metal layer comprising a metal silicide with one or more metal selected from aluminum (Al), gallium (Ga), indium (In) or thallium (Tl) and having a work-function that is at least 0.5 eV less than the work-function of the material of the conformal first work-function metal layer.

10. The method of claim 9, wherein the second work-function metal layer is substantially free of poly silicon and/or doped poly silicon.

* * * * *